(12) United States Patent
Fitzgerald et al.

(10) Patent No.: US 7,218,125 B2
(45) Date of Patent: May 15, 2007

(54) APPARATUS AND METHOD FOR PERFORMING A FOUR-POINT VOLTAGE MEASUREMENT FOR AN INTEGRATED CIRCUIT

(75) Inventors: David John Fitzgerald, Inver Grove Heights, MN (US); Neil Petrie, Saint Louis Park, MN (US); Barrett L. Connolly, Lake Elmo, MN (US); Gregory P. Micko, Cottage Grove, MN (US)

(73) Assignee: Agere Systems Inc, Allentown, PA (US)

( * ) Notice: Subject to any disclaimer, the term of this patent is extended or adjusted under 35 U.S.C. 154(b) by 0 days.

(21) Appl. No.: 11/241,823

(22) Filed: Sep. 30, 2005

(65) Prior Publication Data

US 2007/0075712 A1    Apr. 5, 2007

(51) Int. Cl.
*G01R 27/08*  (2006.01)
*G01R 31/26*  (2006.01)

(52) U.S. Cl. ..................... 324/715; 324/719; 324/724

(58) Field of Classification Search ............... 324/713, 324/715, 719, 691, 724
See application file for complete search history.

(56) References Cited

U.S. PATENT DOCUMENTS

| 4,703,252 | A | * | 10/1987 | Perloff et al. ............... 324/719 |
| 4,816,768 | A | * | 3/1989 | Champlin ................... 324/428 |
| 4,989,154 | A | | 1/1991 | Yamashita et al. |
| 5,691,648 | A | | 11/1997 | Cheng |
| 6,154,041 | A | | 11/2000 | Cheng |
| 6,297,653 | B1 | * | 10/2001 | Hembree .................... 324/755 |
| 6,943,571 | B2 | * | 9/2005 | Worledge ................... 324/719 |
| 2006/0066322 | A1 | * | 3/2006 | Fitzgerald et al. .......... 324/719 |

\* cited by examiner

*Primary Examiner*—Andrew H. Hirshfeld
*Assistant Examiner*—Timothy J Dole

(57) ABSTRACT

A method and apparatus for determining a voltage, such as a bias voltage, supplied by an integrated circuit. A nominal terminating resistor is connected across a first and a second input/output pads from which the voltage is supplied. The voltage is measured across third and fourth pads connected, respectively, to the first and second pads. In an alternative embodiment the functionality of the third and the fourth pads is multiplexed between chip operational circuitry unrelated to the voltage to be measured and a connection to the first and second pads for measuring the voltage.

19 Claims, 8 Drawing Sheets

APPARATUS AND METHOD FOR PERFORMING A FOUR-POINT VOLTAGE MEASUREMENT FOR AN INTEGRATED CIRCUIT

FIELD OF THE INVENTION

The present invention relates generally to integrated circuit testing and specifically to performing a four-point voltage measurement on an integrated circuit.

BACKGROUND OF THE INVENTION

Disk drives are widely accepted as a cost effective data storage system for a computer, music player or other data processing devices. As shown in FIG. 1, a disk drive system 10 comprises a magnetic recording medium, in the form of a disk or platter 12 having a hub 13 and a magnetic read/write transducer 14, commonly referred to as a read/write head. The read/write head 14 is attached to or formed integrally with a suspension arm 15 suspended over the disk 12 and affixed to a rotary actuator arm 16. A structural arm 18, supported by a platform 20, is pivotably connected to the actuator arm 16 at a pivot joint 22. A voice coil motor 24 drives the actuator arm 16 to position the head 14 over a selected position on the disk 12.

As a spindle motor (not shown) rotates the disk 12, the moving air generated by the rotating disk in conjunction with the physical features of the suspension arm 15 lifts the read/write head 14 away from the platter 12, allowing the head 14 to glide or fly on a cushion of air slightly above an upper surface of the disk 12. The flying height of the read/write head 14 over the disk surface is typically less than a micron.

An arm electronics module 30 may include circuits that switch the head function between read and write operations, a write driver for supplying write current to the head 14 during write operations and an amplifier for amplifying the read signal. The arm electronics module 30 is connected to the head 14 by flexible conductive leads 32

The configuration and components of the electronics module 30 vary according to the disk drive design as will be understood by persons familiar with such technology. Although the module 30 may be mounted anywhere in the disk drive 10, a location proximate the head 14 minimizes signal losses and induced noise in the head signals during a read operation. A preferred mounting location for the module 30 comprises a side surface of the structural arm 18 as shown in FIG. 1.

The disk 12, shown in a partial cross-sectional schematic view in FIG. 2 comprises a substrate 50 and a thin film 52, disposed thereover. The magnetic transducer or head 14 comprises a write head 14A for writing data bits to the disk 12 by altering magnetic domains of ferromagnetic material in the film 52, thereby creating magnetic transitions in the magnetic domains. A read head 14B reads the magnetic transitions to determine the stored data bit.

Data bits and timing information to be written to the disk 12 are supplied by a data processing device 60 (e.g. a computer or music player) in the form of bipolar data pulses in PECL (positive emitter-coupled logic) form. Typically, the PECL bipolar signals representing a logic one and a logic zero differ by about 200 mV or by about 450 mV. The data and timing pulses are supplied to a data write circuit 62 where the data bits are formatted and error detection/correction information appended thereto.

To write data bits, the voice coil motor 18 moves the suspension arm 16 to a desired radial position above the surface of the disk 12 while the spindle motor rotates the disk 12 to move a circumferential region to be written under the write head 14A. A write driver 66A of a preamplifier 66 (in one embodiment the preamplifier 66 is disposed within the electronics module 30) supplies a write current (in certain applications between about 10 mA and 70 mA) to the write head 14A responsive to the signal from the data write circuit 62. The write driver 66A scales up the relatively low voltage levels representing the data bits to a voltage range between about +/−6V and +/−10V. In one embodiment the write driver 66A converts the PECL signals to logic signals having a larger differential voltage, such as about 3.3V. The write driver 66A also shapes the write current signal waveform to optimize the data writing process.

Write current supplied by the write driver 66A to the write head 14A (magnetically coupled to a magnetically permeable core not shown) creates a magnetic field that extends from the core across an air gap between the write head 14A and the disk 12. The magnetic field alters a region of ferromagnetic domains in the thin film 52 to store the data bits as magnetic transitions.

The direction of the magnetic field generated by the write head 14A, and thus the direction of the altered ferromagnetic domains, is responsive to the direction of current flow through the write head 14A. Current supplied in a first direction through the write head 14A aligns the domains in a first direction (representing a date 0 for example) and current supplied in a second direction (representing a data 1 for example) aligns the domains in a second direction.

In the read mode, transitions between adjacent domains are detected to determine the stored data bit. The read head 14B (comprising either a magneto-resistive (MR) sensor or an inductive sensor) senses the magnetic transitions in the thin film 52 to detect the stored data bits. A differential output signal produced by the MR sensor responsive to the magnetic transitions has a higher magnitude and a higher signal-to-noise ratio than an output signal produced by the inductive sensor. The MR sensor is thus preferred, especially when a higher areal data storage density is desired. State-of-the-art MR read heads include giant magnetoresistive (GMR) heads and tunneling magnetoresistive (TMR) heads.

The suspension arm 16 moves the head 14 while the disk 12 rotates to position the read head 14B above a magnetized region to be read. A DC (direct current) bias voltage of between about 0.025V and about 0.3V is supplied to the read head 14B by a read circuit 66B of the preamplifier 66. Magnetic domains in the thin film 52 passing under the read head 14B alter a resistance of the magneto-resistive material, imposing an AC (alternating current) component on the DC bias voltage. The AC component representing the read data bits has a relatively small magnitude (e.g., several millivolts) with respect to the DC bias voltage.

The differential read output signal, having an amplitude in a range of several millivolts, is input to a signal processing stage 102 followed by an output or converter stage 104. Typically, both the signal processing stage 102 and the output stage 104 are elements of the preamplifier 66. The signal processing stage 102 amplifies the signal to increase the signal's signal-to-noise ratio. The output stage 104 scales up the head signal voltage to a peak voltage value in a range of several hundred millivolts, supplying the scaled-up signal to channel circuits of a channel chip 106 through an interconnect 108. The channel chip 106 detects the read data bits from the voltage pulses, while applying error detection and correction processes to the read data bits. The read data bits are returned to the processing device 60 via a user interface 110 (e.g., SATA, SCSI, SAS, PCMCIA interfaces).

In other data storage systems the head 14 operates with different types of storage media (not shown in the Figures) comprising, for example, a rigid magnetic disk, a flexible magnetic disk, magnetic tape and a magneto-optical disk.

To increase storage capacity, a disk drive may comprise a plurality of stacked parallel disks 12. A read/write head is associated with each disk to write data to and read data from a top and bottom surfaces of each disk.

Integrated circuits such as the electronics module 30 described above, typically comprise a silicon semiconductor substrate and semiconductor devices, such as transistors, formed from doped regions within the substrate. Interconnect structures are formed in parallel-like layers overlying the semiconductor substrate to provide electrical connection between devices to form electrical circuits. A conventional interconnect system comprises a plurality of substantially vertical conductive vias or plugs and substantially horizontal conductive interconnect runners or traces, with a dielectric layer disposed between two vertically adjacent interconnect layers. The uppermost interconnect layer comprises a plurality of bond pads for receiving conductive bond wires or solder balls to interconnect the devices of the integrated circuit to off-chip external contacts, such as pins or leads of a package structure.

The integrated circuits are fabricated by forming regions of different materials, such as doped regions, dielectric regions and conductive regions, in a semiconductor wafer and on an upper surface thereof. Hundreds of such integrated circuits or die are formed on a single wafer by performing a plurality of sequential fabrication process steps (e.g., implanting and diffusing dopants, depositing materials on the upper surface of the wafer, patterning conductive regions) to form multiple die in the wafer, each die comprising active devices, passive devices (e.g., capacitors and resistors) and the interconnect structures. The manufacturing process steps are carefully developed to maximize the number of integrated circuits that satisfy desired operational specifications.

After completion of the fabrication steps, each die undergoes electrical testing (referred to as wafer probe testing) so that only those die that satisfy applicable performance specifications are accepted. After the wafer is singulated, the accepted die are packaged to protect the integrated circuit from contamination and damage. Package leads provide electrical connection of the integrated circuit to other electronic components, such as electronic components mounted on a printed circuit board with the packaged integrated circuit.

It is necessary for the preamplifier 66 of the electronics module 30 to provide an accurate read head bias (i.e., a DC voltage bias or a DC current bias) to avoid head degradation and improve data reading accuracy. Each preamplifier is evaluated during the wafer probe test to stage to determine whether the bias is within specifications. During the test, the preamplifier is powered through test probes that supply the necessary externally generated power supply voltages to certain conductive pads of the preamplifier integrated circuit. The bias voltage generated on-chip is then measured by test probes in contact with other conductive pads.

It is known that contact resistance between a wafer probe tip and the associated contact region of a bond pad can cause bias measurement errors. Further, contact resistance can increase as testing progresses among die on a wafer as the probe tips collect dirt from the wafer surface. Increased probe tip resistance can cause substantial errors in the measured value of the bias voltage, possibly resulting in misidentification and rejection of otherwise good preamplifiers—or passing unacceptable preamplifiers as acceptable.

A similar bias test is performed for preamplifiers that supply a bias current. The bias current is determined by causing the bias current to flow through a know resistance connected to the wafer test probes and measuring the voltage across the resistance.

A prior art head bias wafer probe test circuit 199 depicted in FIG. 3 is one such test probe circuit sensitive to the effects of wafer probe contact resistance when the bias voltage (or current) is measured. A preamplifier on-chip circuit, represented by a voltage source 200, generates and supplies a bias voltage to input/output pads HRP and HRN during the wafer probe test. When the preamplifier is operational in the disk drive data storage system 10, the input/output pads HRP and HRN are connected to the read head 14B. In the circuit 199, a load resistor $R_{MR}$, having a resistance equivalent to a nominal head resistance, is connected across the input/output pads HRP and HRN and a voltage measured across these pads indicates the bias voltage. The wafer probe resistances are modeled in FIG. 3 by resistors $R_{PAR1}$ and $R_{PAR2}$. A voltage measured by the voltmeter 202 is:

$$V_{MEASURED} = V_{BIAS} \left( \frac{R_{MR}}{R_{MR} + R_{PAR1} + R_{PAR2}} \right) \quad (1)$$

When probing many die across the wafer the probe tips become dirty and the contact resistances $R_{PAR1}$ and $R_{PAR2}$ increase. As can be seen from equation (1), the increased resistance lower the measured voltage relative to the bias voltage. When the disparity between the measured voltage and the bias voltage is so great as to cause the measured voltage to fall below a minimum acceptable bias voltage value, the preamplifier may be rejected as unacceptable. Thus the probe tip contact resistance can adversely influence yield determinations by identifying as faulty devices that generate a correct bias voltage.

The error in the measured voltage is the difference between the actual bias voltage $V_{BIAS}$ and the measured voltage $V_{MEASURED}$:

$$\text{Error } [\%] = \left( \frac{R_{MR}}{R_{MR} + R_{PAR1} + R_{PAR2}} - 1 \right) * 100\%$$

For a nominal value of $R_{MR}=40\Omega$ (for a GMR read head) and expected values of $0.50\Omega$ for each of $R_{PAR1}$ and $R_{PAR2}$, the error is:

$$\text{Error } [\%] = \left( \frac{R_{MR}}{R_{MR} + R_{PAR1} + R_{PAR2}} - 1 \right) * 100\% =$$
$$\left( \frac{40}{40 + 0.50 + 0.50} - 1 \right) * 100\% = 2.4\%$$

It is known that as the probes become dirty during testing the contact resistance can typically increase to a few ohms, thereby increasing the percentage measurement error.

Current methods for detecting an unacceptably high probe contact resistance include monitoring the measured bias voltage to identify declining voltage values and monitoring the results of any tests that are sensitive to probe contact resistance, such as the bias measurement test of FIG. 3. After an unusually large number of integrated circuits are identified as faulty the test sequence may be paused while the probe tips are cleaned (to reduce the contact resistance) and devices previously identified as faulty are retested. The retesting process wastes time and adds cost to the wafer probe tests. Furthermore, some integrated circuits that passed the wafer probe test prior to probe cleaning may have been faulty.

The combination of various fabrication and operational anomalies can cause performance parameters of an integrated circuit (such as the bias voltage or current) to vary. These variations may cause the parameter to exceed an acceptable range above or below a nominal value. These variations must be controlled to ensure the performance parameters are within the acceptable range and the testing process must properly identify the devices that are outside the acceptable range.

By way of example, the total allowable variation in the bias voltage measurement of a preamplifier may be limited to 7 percent. Factors contributing to this range include fabrication process limitations and operational anomalies that directly affect the bias voltage or current generated on the integrated circuit, and the aforediscussed wafer test anomalies that affect the measured value. The cumulative fabrication and operational anomalies may introduce considerable measurement variability, leaving little head room to accommodate anomalies of the testing process.

It is not uncommon to encounter a variation of 1–1.5 percent in a bias reference circuit (e.g., a band-gap voltage reference) that supplies the reference voltage (or current) to the circuit elements that generate the head bias voltage (or current). Operating temperature, semiconductor process variations and mismatches between integrated circuit devices may add another 2–4 percent. Adding variations in wafer probe contact resistance causes the cumulative variation to approach and perhaps exceed the 7 percent limit, especially as the contact resistance increases. Most test processes use an error margin or guard band of about 1 percent lowering the acceptable margin from 7 percent to 6 percent, further increasing the probability that the cumulative error specification will not be satisfied.

If the cumulative effect of the several factors contributing to test circuit error exceed a specified limit, e.g., 7 percent, there will be an increase in the number of die that fail the probe test because of error associated with the test circuitry and the measurement process. The number of failed integrated circuits therefore increases. While it is important to reduce the contribution of each anomaly to the cumulative measurement error, such reductions may be costly. For example, reducing the effects of fabrication anomalies may require the development of new process steps or the purchase of new process equipment that permits tighter control over the fabrication process and reduces variations in measurable parameters, such as voltages. Clearly there is a need to reduce the effects of probe contact resistance to minimize error associated with bias voltage measurement.

BRIEF SUMMARY OF THE INVENTION

According to one embodiment, the invention comprises a test apparatus for measuring a signal generated on an integrated circuit by a source during a testing mode, wherein the signal is supplied to first and second bond pads of the integrated circuit, and wherein during an operational mode an operational component is connected to the first and second bond pads. The test apparatus comprises first and second conductive elements for connecting the first and the second bond pads to a resistive element having a value related to a value of the operational component, a measuring device and third and fourth conductive elements for connecting the measuring device to third and fourth integrated circuit bond pads responsive to the source.

According to another embodiment, the present invention comprises a method for measuring a signal generated by a source disposed on an integrated circuit during a test, wherein the signal is supplied to first and second bond pads of the integrated circuit, and wherein during an operating mode an operational component is connected across the first and second bond pads. The method comprises connecting a resistive element having a value related to a value of the operational component across the first and the second bond pads and connecting a measuring device to third and fourth integrated circuit bond pads responsive to the source to determine a measured signal.

BRIEF DESCRIPTION OF THE DRAWINGS

The invention can be more easily understood and the advantages and uses thereof more readily apparent when the following detailed description is read in conjunction with the figures wherein.

In accordance with common practice, the various described device features are not drawn to scale, but are drawn to emphasize specific features relevant to the invention. Like reference characters denote like elements throughout the figures and text.

DETAILED DESCRIPTION OF THE INVENTION

Before describing in detail an exemplary method and apparatus, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The illustrated embodiments are permissive rather than mandatory and are not exhaustive. Use of the present invention is not limited to a disk drive storage system and the invention can be used in applications other than those described herein.

Figure 4:
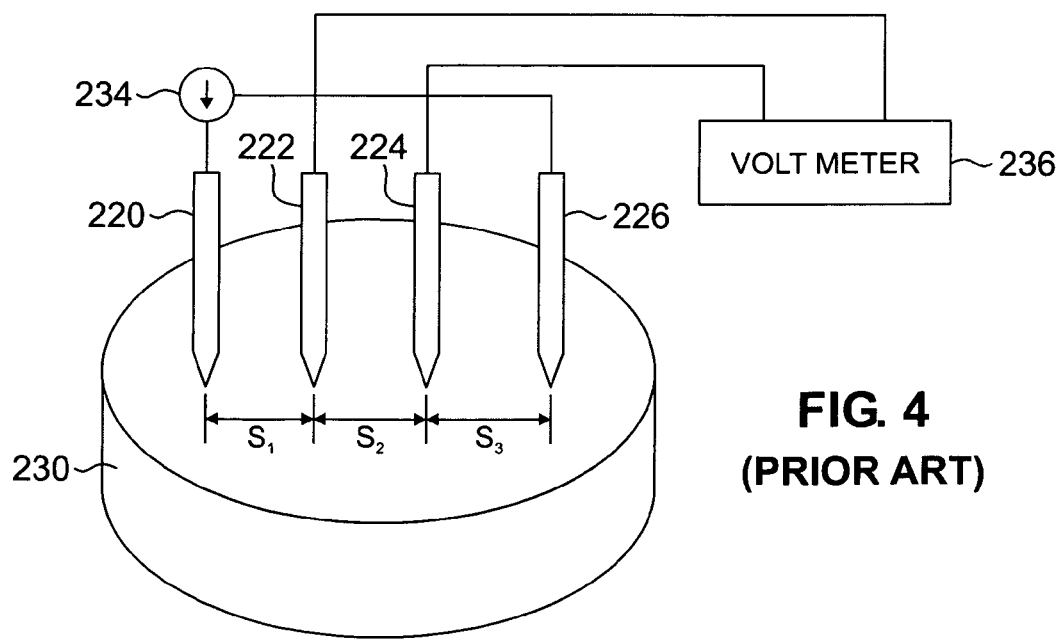
FIG. 4 illustrates a prior art four-point wafer probe test circuit.

Four-point probe tests are used for measuring the resistivity (i.e., sheet resistance) of semiconductor regions in order to eliminate errors caused by wafer probe contact resistance. Components of a four-point probe test circuit, depicted in FIG. 4 include four collinear tungsten probes 220, 222, 224 and 226 in contact with a sample 230 under test. Current I supplied by a current source 234 flows between the outer probes 220 and 226 and through the sample 230. A voltage V is measured across the two inner probes 222 and 224 by a voltmeter 236. Ideally, the voltmeter 236 draws an insubstantial current so as not to jeopardize the accuracy of the results. If the sample 230 is assumed to be of semi-infinite volume and the interprobe spacings are equal, i.e., $s_1=s_2=s_3=s$, then it can be shown that the resistivity of the sample 230 is given by $\varrho=2\pi sV/I$, where V is the measured voltage and I is the supplied current.

According to the invention, a four-point probe assembly measures the read head bias voltage, while limiting the effects of probe contact resistance on the measured value. The assembly can also measure other on-chip voltages that are sensitive to the wafer probe contact resistance, such as an output voltage of an analog-to-digital converter or an on-chip band gap reference voltage (a master reference voltage that controls other voltages generated on-chip).

In one embodiment of the invention, bond pads used for other purposes during operation are employed during the wafer probe testing process to measure the bias voltage. During the test, these pads, including either or both output pads and input pads, are disconnected from their associated on-chip output or input circuits and connected to a four-point measurement circuit through controlled multiplexers. In addition to measuring the head bias voltage, the wafer probe contact resistance can be determined.

Figure 5:
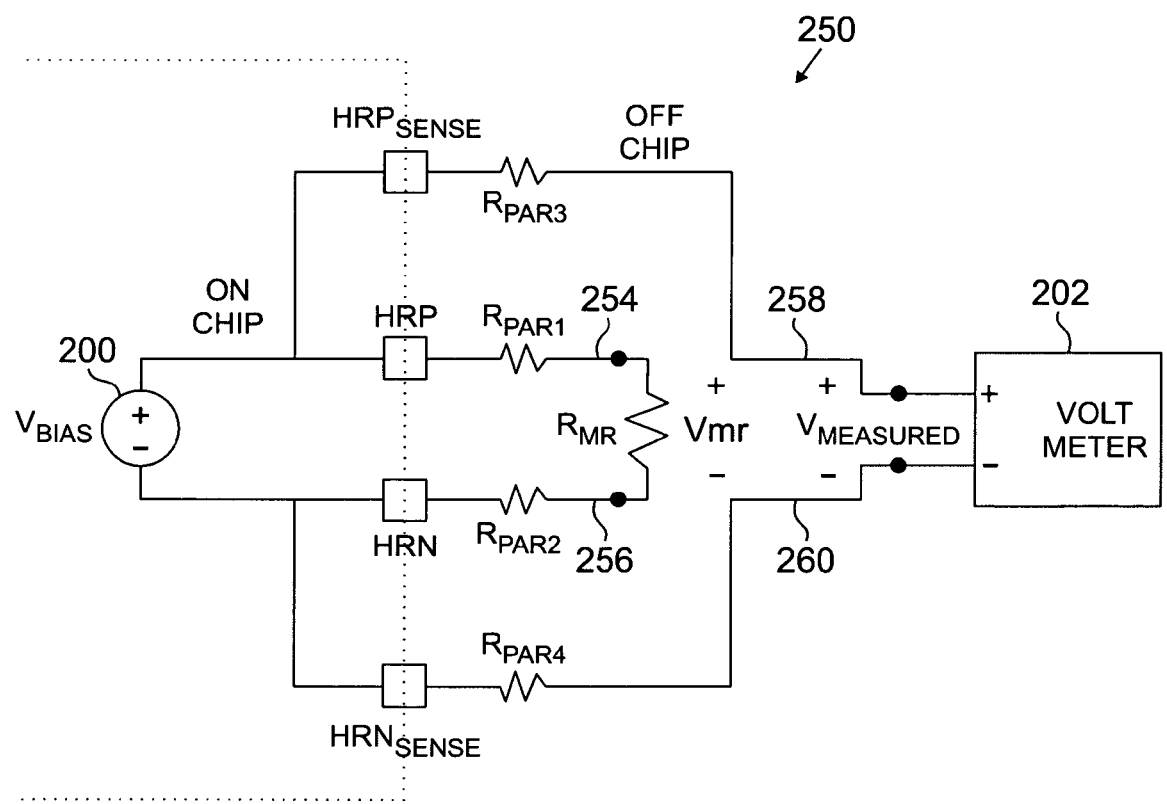
FIGS. 5–9 illustrates various embodiments of a wafer probe test circuit according to the teachings of the present invention.

An embodiment of a wafer probe test circuit 250 of the present invention is illustrated in FIG. 5. The test circuit 250 comprises four input/output pads designated HRP, HRN, $HRP_{SENSE}$ and $HRN_{SENSE}$. During the test, a resistance $R_{MR}$, representing a nominal head resistance, is connected across the terminals or pads HRP and HRN through test probes 254 and 256. A contact resistance of the test probes 254 and 256 is identified by resistances $R_{PAR1}$ and $R_{PAR2}$. The voltmeter 202 is connected across the terminals or pads $HRP_{SENSE}$ and $HRN_{SENSE}$ through test probes 258 and 260, each having a respective contact resistance $R_{PAR3}$ and $R_{PAR4}$. The input impedance of the voltmeter 202 ($Zin_{METER}$) is very large compared to the contact resistance of the test probes 258 and 260 and is therefore assumed to be infinite, i.e., no current is drawn by the voltmeter 202. The measurement for the head bias, i.e., the voltage measured across $HRP_{SENSE}$ and $HRN_{SENSE}$ in the wafer probe test circuit 250 is:

$$V_{MEASURED} = V_{BIAS}\left(\frac{Zin_{METER}}{Zin_{METER} + R_{PAR3} + R_{PAR4}}\right)$$

Using a nominal probe contact resistance of 0.5Ω, the associated error is:

Error [%] =

$$\left(\frac{Zin_{METER}}{Zin_{METER} + R_{PAR3} + R_{PAR4}} - 1\right)*100\% = \left(\frac{10^6}{10^6 + 10^3 + 0.50} - 1\right)*100\%$$

The error approaches zero as $Zin_{METER}$ becomes very large relative to the contact resistances. Thus the measured voltage for the test circuit 250 approaches the bias voltage irrespective of the nominal contact resistance values. By way of example, when $Zin_{METER}$ has a one megaohm internal impedance, assuming each probe has a contact resistance of 0.5 ohm, the error between the measured voltage and the actual bias voltage is less than 1 percent.

After determining $V_{MEASURED}$ as above, the voltmeter 202 may be used to measure a voltage across the load resistor $R_{MR}$ (having a known resistance) and a measured voltage $V_{MR}$ is compared to the measured voltage $V_{MEASURED}$ to calculate the total contact resistance of the test probes 254 and 256 from:

$$R_{PAR1} + R_{PAR2} = \left(\frac{V_{MEASURED}}{V_{MR}} - 1\right)*R_{MR} \quad (2)$$

Figure 1:
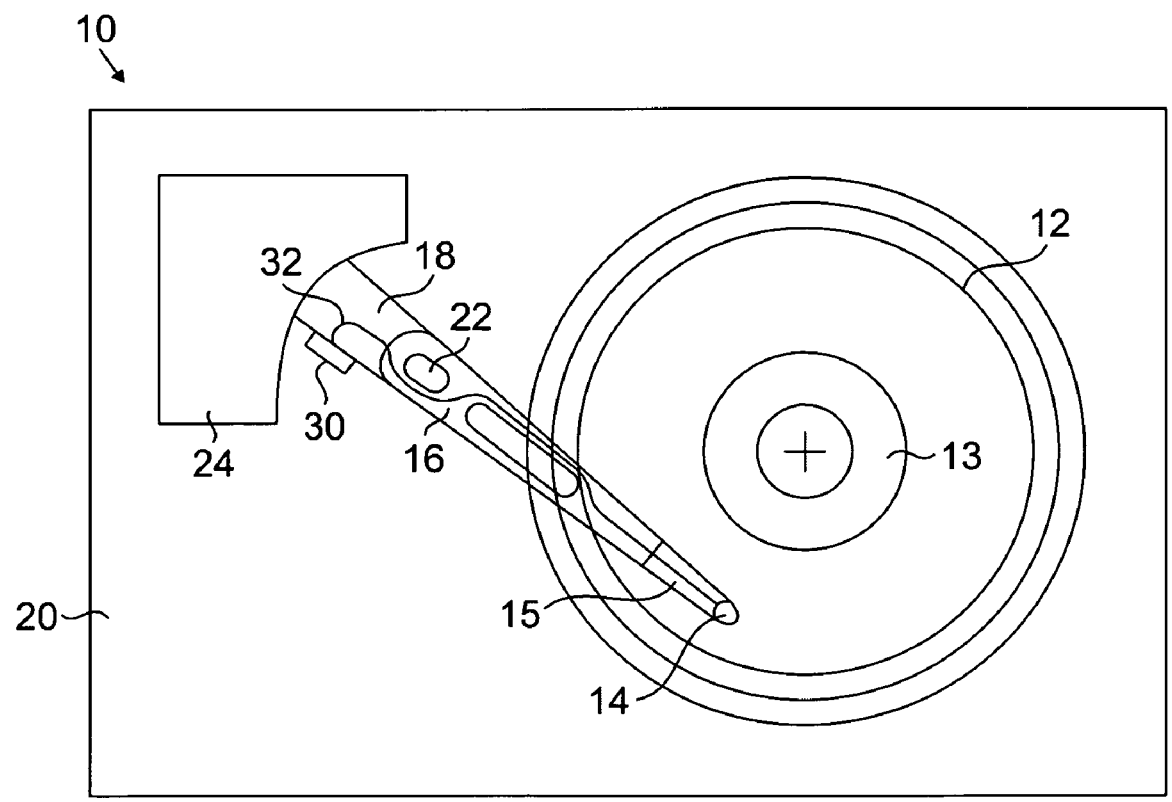
FIG. 1 illustrates a prior art disk drive to which the teachings of the present invention can be applied.
Figure 2:
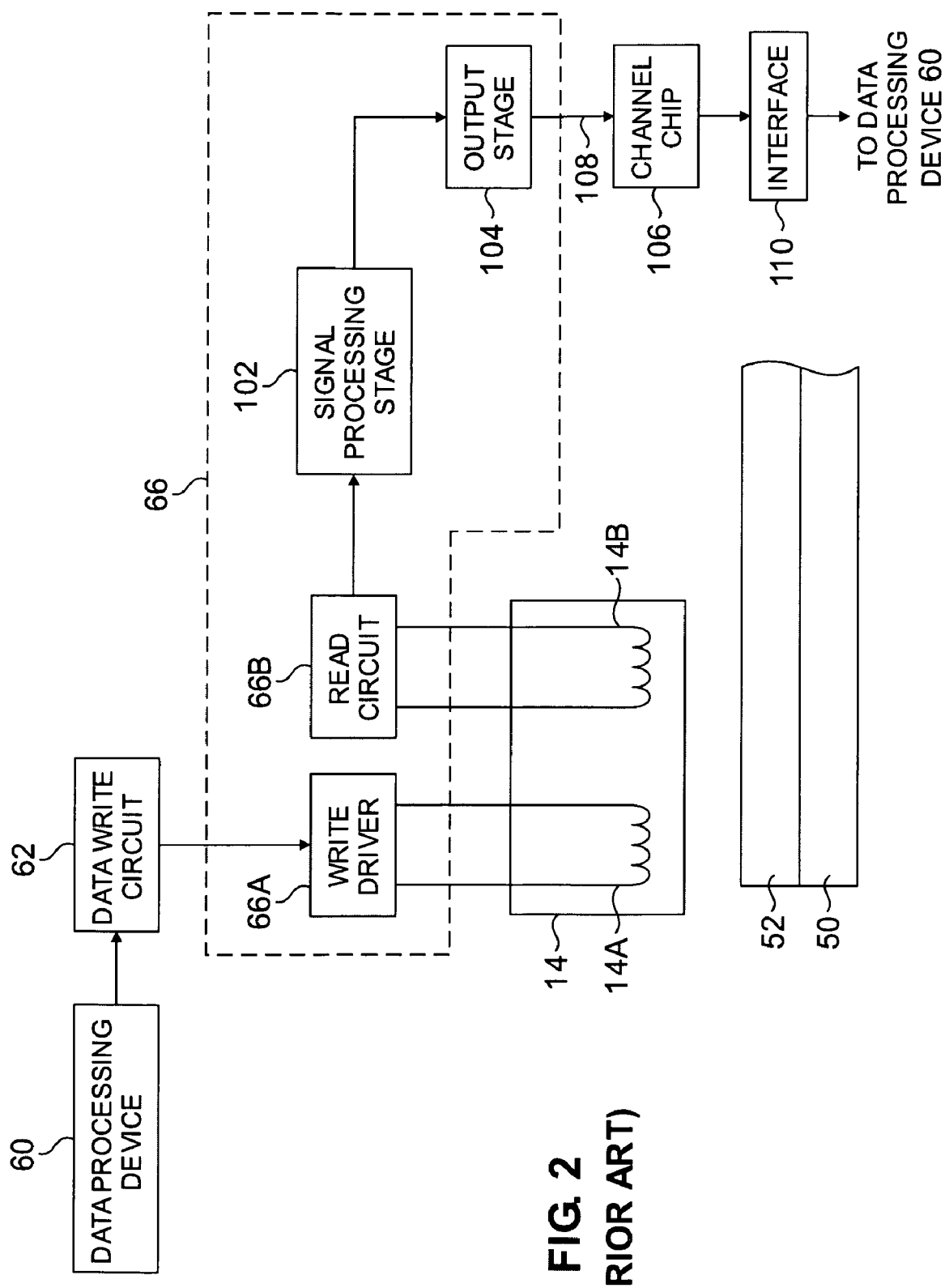
FIG. 2 is a partial cross-sectional schematic view of a prior art head and related components of the disk drive of FIG. 1.
Figure 3:
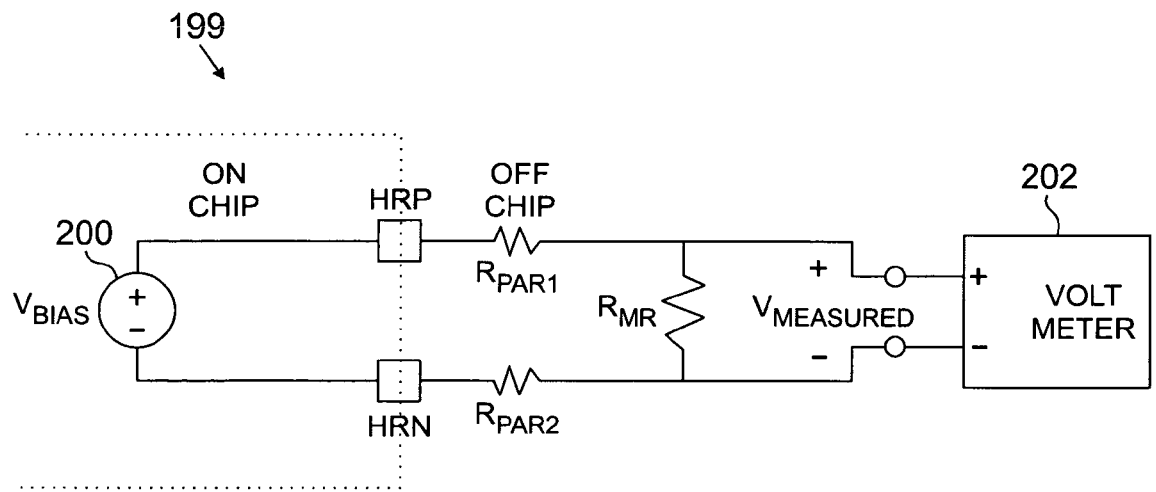
FIG. 3 illustrates a prior art head bias wafer probe test circuit.

The wafer probe test circuit 250 can be used to more accurately determine an on-chip voltage (such as the read head bias voltage supplied by a preamplifier within the electronics module 30 of FIG. 1) than the prior art wafer probe test circuit 199 depicted in FIG. 3. However, since each test probe 254, 256, 258 and 260 must contact a bond pad to measure the bias voltage, the FIG. 5 embodiment requires two additional bond pads, i.e., $HRP_{SENSE}$ and $HRN_{SENSE}$ as the bond pads HRP and HRN are conventionally fabricated for connecting the read head 14B to the integrated circuit for operation in the disk drive data storage system 10. As is known, provision of additional bond pads is often undesirable as each pad occupies a significant die area and can be costly to fabricate.

According to another embodiment, one or more bond pads are multiplexed between functioning as the bond pads $HRP_{SENSE}$ and $HRN_{SENSE}$ during wafer probe testing and operating normally with the associated circuitry during integrated circuit operation. An on-chip multiplexing device disconnects the bond pads from their operational circuits for connection to the wafer probe test circuit and reconnects the bond pads to their operational circuits during operation.

Figure 6:
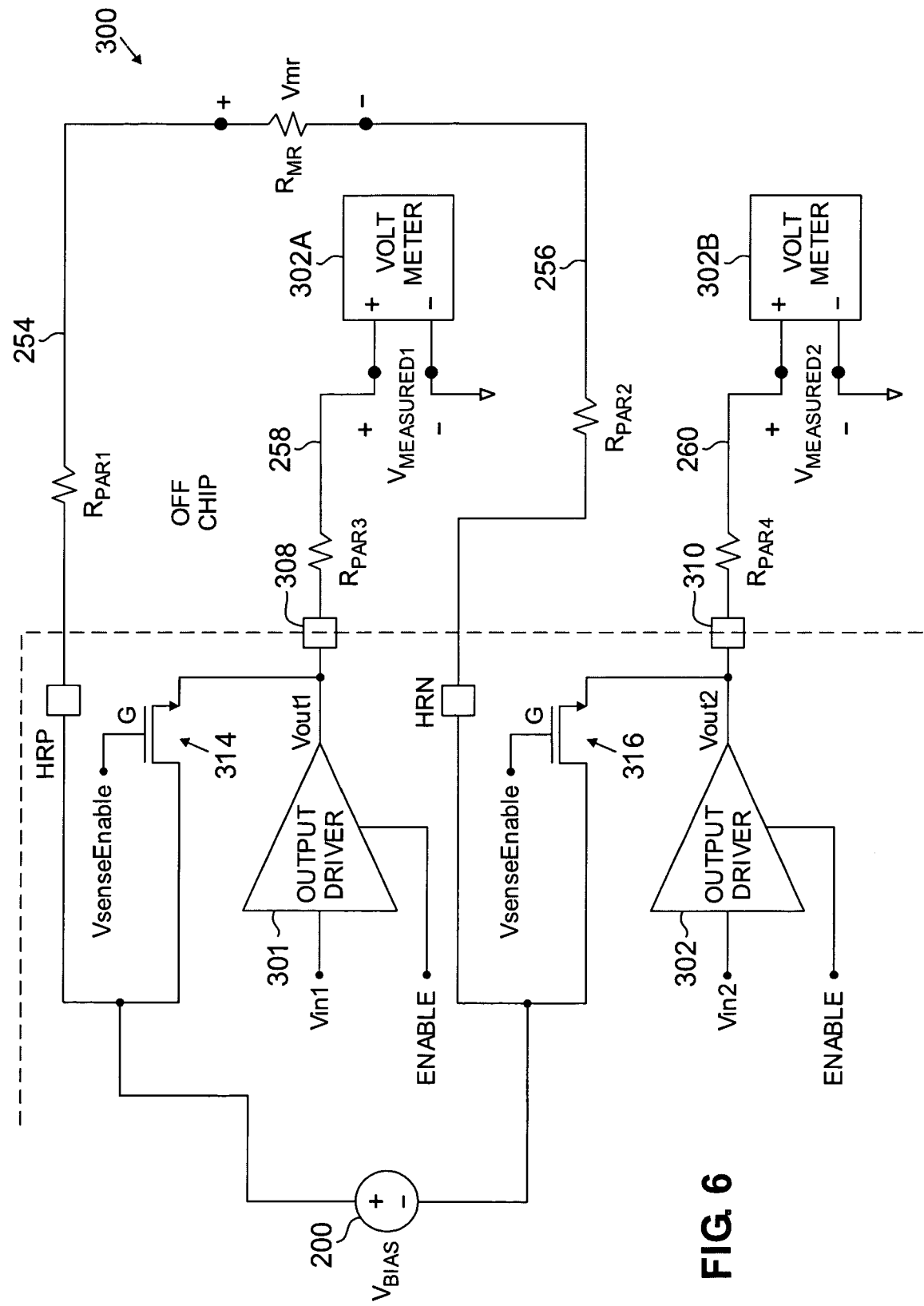

Each integrated circuit may include several bond pads suitable for multiplexed operation and therefore suitable for use as the bond pads $HRP_{SENSE}$ and $HRN_{SENSE}$. Certain on-chip fault conditions and off-chip fault conditions detected on-chip generate fault signals Vin1 and Vin2 that are supplied to output drivers 301 and 302 (see FIG. 6) for generating output signals Vout1 and Vout2 suitable for driving off-chip fault indicating elements via respective bond pads 308 and 310. Exemplary fault conditions that generate a fault signal Vin1 or Vin2 include on-chip detection of a low voltage level supplied from an off-chip source, detection of an open write head and detection of an over-temperature condition on the integrated circuit. As illustrated in FIG. 6, an enable signal controls each of the output drivers 301 and 302.

To measure the on-chip bias voltage represented by the voltage source 200, the resistor $R_{MR}$ representing the read head is connected to the output pads HRP and HRN through test probes 254 and 256. The bias voltage is connected directly to the output pads HRP and HRN and to the bond pads 308 and 310 by dosing (enabling) the transmission gates 314 and 316 in response to a signal VsenseEnable applied to a control terminal G of each transmission gate 314 and 316.

An appropriate enable signal is supplied to the output drivers 301 and 302 to disable the drivers such that they present a high output impedance at the bond pads 308 and 310. The voltmeters 302A and 302B measure the voltages $V_{MEASURED1}$ and $V_{MEASURED2}$, respectively, with respect to ground, at the bond pads 308 and 310 through the test probes 258 and 260.

An "on" resistance of the transmission gates 314 and 315, designated $R_{ON}$ in the equations below, is preferably small compared with an input impedance of the voltmeters 302A and 302B. In an embodiment where the input impedance of each voltmeter 302 is 1 MΩ, and the value of $R_{ON}$ is assumed to be 1 kΩ, the error between the bias voltage 200 and the single ended voltage measurements with respect to ground is:

$$\text{Error } [\%] = \left(\frac{Zin_{METER}}{Zin_{METER} + R_{ON} + R_{PAR3}} - 1\right) * 100\% =$$

$$\left(\frac{10^6}{10^6 + 10^3 + 0.50} - 1\right) * 100\% \approx -0.1\%$$

An error of 0.1% may be safely ignored and does not significantly affect the measurement nor substantially contribute to the 6 percent or 7 percent margin. The measurements conducted by the wafer probe test circuit 300 of FIG. 6 are thus substantially insensitive to the wafer probe contact resistance $R_{PAR3}$ and $R_{PAR4}$ and the transmission gate resistance $R_{ON}$. Preferably, the output drivers 301 and 302 exhibit a high output impedance in an off or disabled state to minimize effects on the wafer probe test circuit 300.

The two single ended measured voltages may be summed to obtain the measured bias voltage:

$$V_{BIAS} \approx V_{MEASURED} = V_{MEASURED1} + V_{MEASURED2} \quad (3)$$

If needed, the total contact resistance $R_{PAR1} + R_{PAR2}$ can be calculated according to equation (2) above.

In another embodiment bond pads other than pads 308 and 310 and their associated drivers 301 and 302 can be used for the wafer probe test if the on-chip devices connected to the bond pads can be controlled to an off state and if the devices exhibit a relatively high output impedance when in the off state.

In the FIG. 6 embodiment the transmission gates 314 and 316 are depicted as NMOSFET devices with the control terminal comprising a gate terminal. In other embodiments the transmission gates comprise PMOSFET devices responsive to an opposite-polarity control signal or a complementary pair of a parallel PMOSFET and an NMOSFET device controlled by a VsenseEnable signal and its complement signal.

Figure 7:
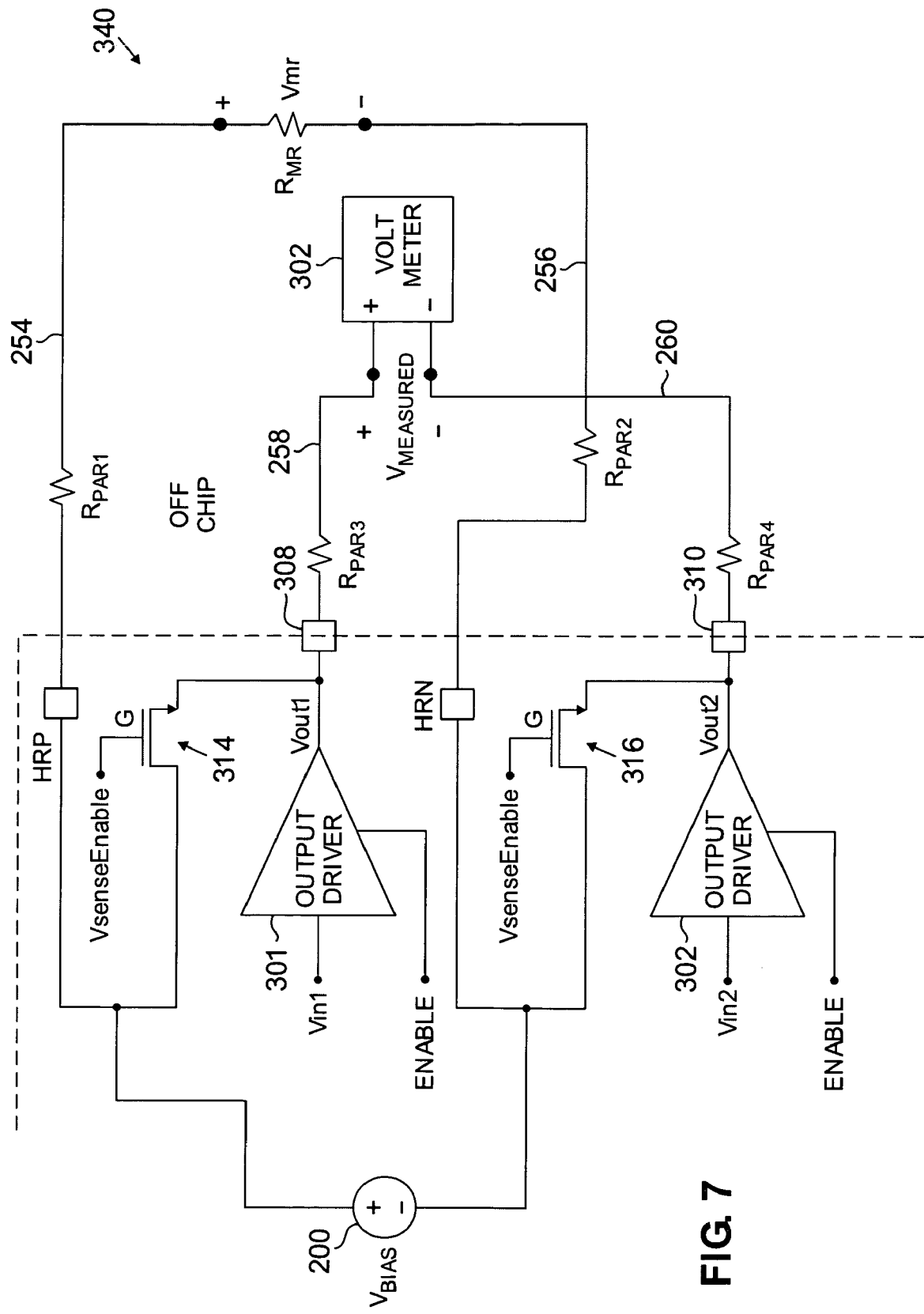

In an alternative embodiment illustrated in FIG. 7, a wafer probe test circuit 340 replaces the two single-ended voltage measurements $V_{MEASURED1}$ and $V_{MEASURED2}$ of FIG. 6 with a single voltage measurement $V_{MEASURED}$ across the bond pads 308 and 310. In this embodiment, $$V_{BIAS} \approx V_{MEASURED}.$$

Figure 8:
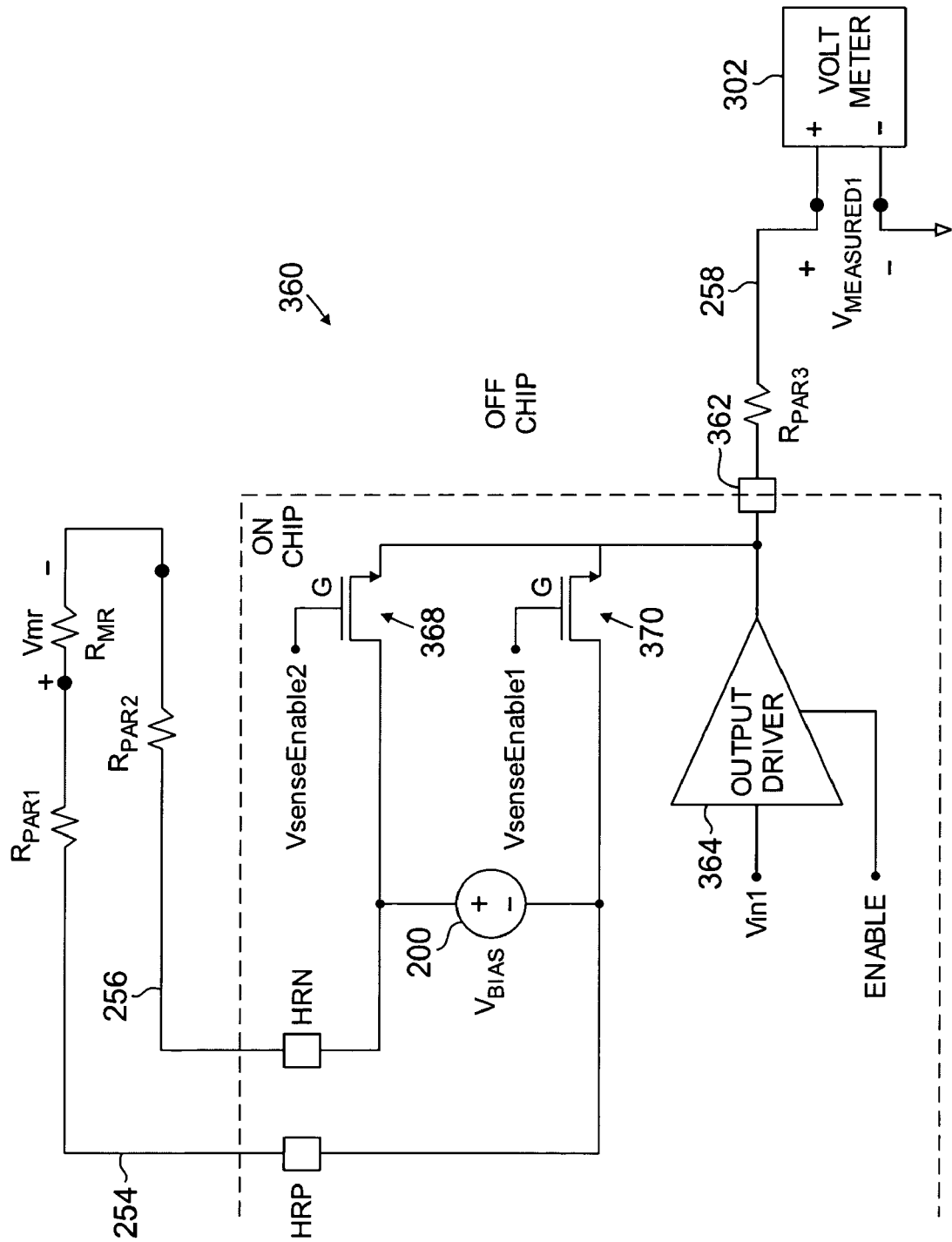

A wafer probe test circuit 360 illustrated in FIG. 8 utilizes a single multiplexed bond pad 362 to determine the bias voltage. Single-ended (i.e., measured with respect to ground) bias voltages $V_{BIAS}+$ and $V_{BIAS}-$ are connected to the bond pad 362 by disabling an output driver 364 and alternately enabling one of the transmission gates 368 and 370 and disabling the other by applying appropriate VsenseEnable1 and VsenseEnable2 signals to control terminals G. The two resulting single-ended voltage measurements determined by the voltmeter 302 are combined according to equation (3) above to determine the bias voltage supplied by the voltage source 200.

Figure 9:
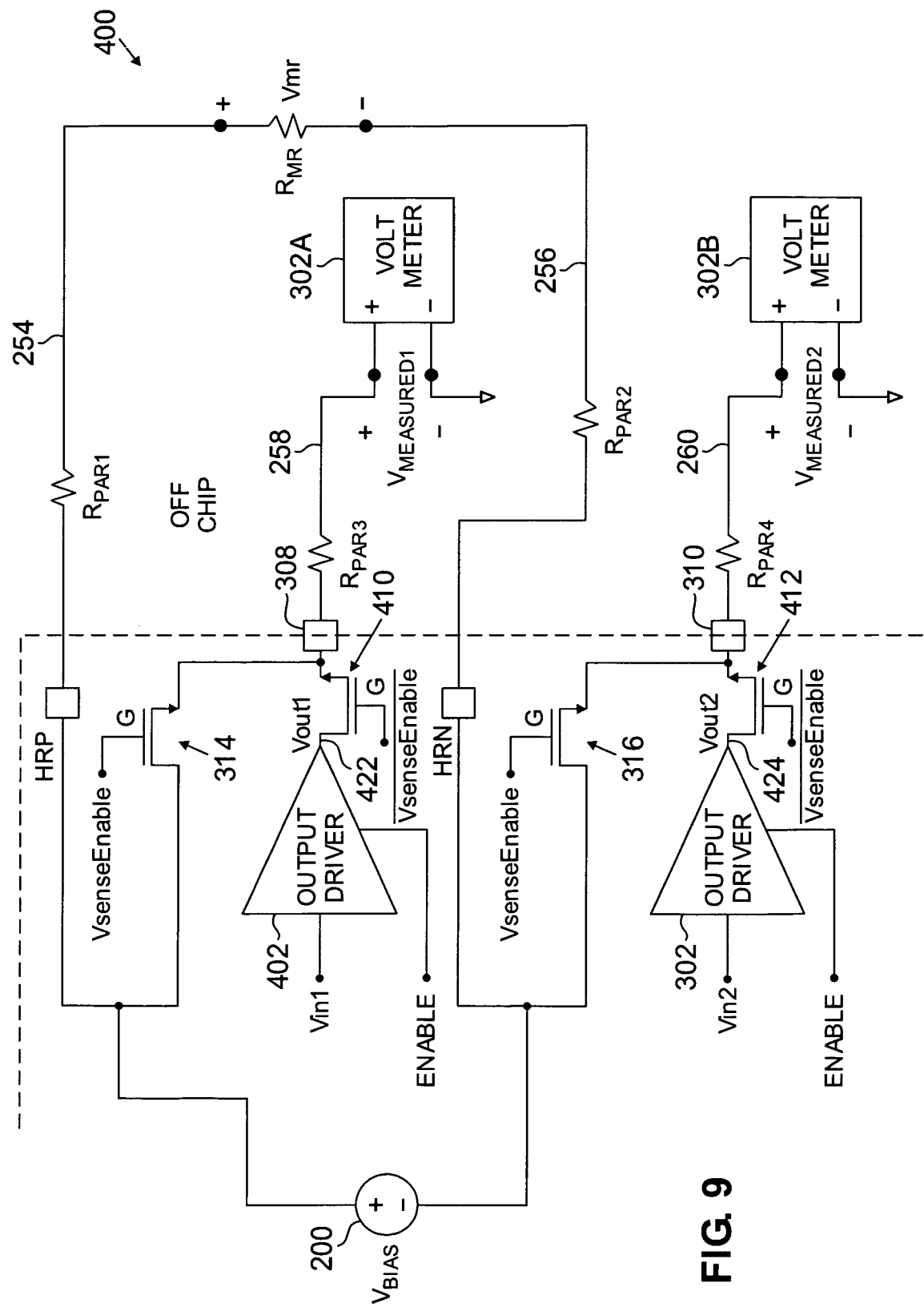

Another embodiment of a wafer probe test circuit 400 of FIG. 9 may be suitable when an output impedance of output drivers 402 and 404 is not sufficiently large to allow the impedance to be neglected determining the bias voltage measurement. To remove the effects of the output impedance, transmission gates 410 and 412 are disposed in series between output terminals 422 and 424 of the output drivers 402 and 404 and the bond pads 308 and 310.

To measure the bias voltage, the VsenseEnable signals drive the transmission gates 314 and 316 to a closed state, supplying the bias voltage from the voltage source 200 to the bond pads 308 and 310. The transmission gates 410 and 412 are driven to an open state by applying a complementary signal <VsenseEnable> at a gate G of each transmission gate 410 and 412, creating an open circuit between the bond pads 308 and 310 and the respective output terminals 422 and 424. The voltmeters 302A and 302B measure the voltages $V_{MEASURED1}$ and $V_{MEASURED2}$ with respect to ground through the test probes 258 and 260. The sum of the two measured voltages equals the bias voltage.

To operate the chip (during operation the wafer probe test circuit 400 is absent), the output drivers 402 and 404 are enabled by an appropriate enable signal applied thereto, the VsenseEnable signals drive the transmission gates 314 and 316 to an open state and the complementary signals <VsenseEnable> drive the transmission gates 410 and 412 to a closed state. The output terminals 422 and 424 of the drivers 402 and 404 are thereby connected to the bond pads 308 and 310.

In yet another embodiment, the enable signal controlling the output drivers 402 and 404 may not be required as use of the transmission gates 410 and 412 may be sufficient to limit the effects of the output drivers 402 and 404 on the testing process.

According to the present invention, a method and apparatus are taught for removing the effects of wafer test probe contact resistance while measuring an on-chip voltage or current, such as an MR head bias voltage. The method and apparatus teach a four-point voltage or current measurement method and apparatus using existing integrated circuit bond pads, i.e., without the need to add bond pads to the integrated circuit as it is known such pads can be costly in terms of both fabrication costs and consumed circuit area.

A method and apparatus according to the present invention can also detect onset of an excessive probe contact resistance, at which time the probes can be cleaned, instead of waiting for multiple die failures to suggest that probe cleaning may be warranted and retesting failed die after probe cleaning. Further, once the contact resistance is known, the voltage or current measurements can be mathematically corrected to remove the contact resistance effects. The testing can continue, even with a high probe contact resistance. This process can reduce the probe cleaning frequency and the wafer test time and cost.

The teachings of the present invention can be applied to measuring other on-chip voltages and currents by including multiple controlled multiplexers on-chip and controlling the multiplexers to present the desired voltage for measuring across the bond pads.

Although the present invention has been described with reference to preferred embodiments, it will be understood by those skilled in the art that various changes may be made and equivalent elements may be substituted for the elements thereof without departing from the scope of the invention. The scope of the present invention further includes any combination of elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. A test apparatus for measuring a signal generated on an integrated circuit by a source during a testing mode, wherein the signal is supplied to first and second bond pads of the integrated circuit, and wherein during an operational mode an operational component is connected to the first and second bond pads, the test apparatus comprising:

first and second conductive elements for connecting the first and the second bond pads to a resistive element having a value related to a value of the operational component;

a measuring device; and third and fourth conductive elements for connecting the measuring device to third and fourth bond pads of the integrated circuit responsive to the source through first and second switching elements.

2. The apparatus of claim 1 wherein the resistive element comprises a nominal resistance of a disk drive storage system read head.

3. The apparatus of claim 1 wherein the signal comprises a bias voltage for biasing a read head of a disk drive storage system.

4. The apparatus of claim 1 wherein the signal comprises a bias current for biasing the read head of a disk drive storage system.

5. The apparatus of claim 1 wherein the first, the second, the third and the fourth conductive elements comprise a first, a second, a third and a fourth test probe.

6. The apparatus of claim 1 wherein internal resistance of the measuring device is so large relative to a contact resistance associated with operation of the test apparatus that a measured signal measured by the test apparatus is insensitive to contact resistance.

7. The apparatus of claim 6 wherein influence of contact resistance on signal measurement introduces less than 1 percent error.

8. The apparatus of claim 1 wherein the integrated circuit further comprises a first and a second circuit element each configurable to an operable or a non-operable state and connected to the third and the fourth bond pads, respectively, the first switching element is disposed between a first terminal of the source and the third bond pad, and the second switching element is disposed between a second terminal of the source and the fourth bond pad, wherein in the operational mode the first and the second circuit elements are configured to the operable state and the first and the second switching elements are switched to an open state, and wherein in the testing mode the first and the second circuit elements are configured to the non-operable state and the first and the second switching elements are switched to a closed state to connect the source across the third and the fourth bond pads.

9. The apparatus of claim 8 wherein the first and the second circuit elements comprise a first and a second output driver.

10. The apparatus of claim 8 wherein the first and the second switching elements each comprises a metal oxide semiconductor field effect transistor each having a gate, each gate for receiving a control signal to switch the first and the second transistors to the opened state or to the closed state.

11. The apparatus of claim 1 wherein the measuring device comprises a first measuring device for measuring a first signal between the third bond pad and ground and a second measuring device for measuring a second signal between the fourth bond pad and ground, wherein the signal generated on the integrated circuit comprises a sum of the first and the second signals.

12. The apparatus of claim 1 wherein the measuring device comprises a measuring device for measuring the signal between the third and the fourth bond pads, and wherein the signal represents the signal generated on the integrated circuit.

13. A method for measuring a signal generated by a source disposed on an integrated circuit during a test, wherein the signal is supplied to first and second bond pads of the integrated circuit, and wherein during an operating mode an operational component is connected across the first and second bond pads, the method comprising:

connecting a resistive element having a value related to a value of the operational component across the first and the second bond pads; and connecting a measuring device to third and fourth bond pads of the integrated circuit responsive to the source through first and second switching elements to determine a measured signal.

14. The method of claim 13 further comprising:

switching the first and the second switching elements to a closed configuration to connect the source to the third and the fourth bond pads.

15. The method of claim 13 wherein the step of connecting the measuring device further comprises:

connecting the measuring device to the third integrated circuit bond pad to determine a first referenced signal with respect to a reference;

connecting the measuring device to the fourth integrated circuit bond pad to determine a second referenced signal with respect to the reference; and combining the first and the second referenced signals to determine the measured signal.

16. The method of claim 13 wherein the step of connecting the measuring device comprises connecting the measuring device across the third and fourth integrated circuit bond pads to determine the measured signal.

17. The method of claim 13 wherein the resistive element comprises a resistive element having a resistance of a disk drive storage system read head.

18. The method of claim 13 wherein the step of connecting the measuring device further comprises connecting a first terminal of the measuring device to the third bond pad through a first test probe and connecting a second terminal of the measuring device to the fourth bond pad through a second test probe, wherein a resistance of the measuring device is greater than a contact resistance of both the first and the second test probes.

19. The method of claim 13 further comprising:

determining a signal across the resistive element; and determining a contact resistance of the first and the second test probes from the signal across the resistive element and the measured signal.

* * * * *